United States Patent
Friebe et al.

(10) Patent No.: US 9,865,411 B2
(45) Date of Patent: Jan. 9, 2018

(54) SAFETY DEVICE FOR A PHOTOVOLTAIC SYSTEM

(71) Applicant: SMA Solar Technology AG, Niestetal (DE)

(72) Inventors: Jens Friebe, Vellmar (DE); Sebastian Bieniek, Niestetal (DE)

(73) Assignee: SMA Solar Technology AG, Niestetal (DE)

( * ) Notice: Subject to any disclaimer, the term of this patent is extended or adjusted under 35 U.S.C. 154(b) by 554 days.

(21) Appl. No.: 14/205,606

(22) Filed: Mar. 12, 2014

(65) Prior Publication Data
US 2014/0191589 A1   Jul. 10, 2014

Related U.S. Application Data

(63) Continuation of application No. PCT/EP2012/067667, filed on Sep. 10, 2012.

(30) Foreign Application Priority Data

Sep. 12, 2011   (DE) .................. 10 2011 053 524

(51) Int. Cl.
*H01H 47/00* (2006.01)
*H01H 9/54* (2006.01)
(Continued)

(52) U.S. Cl.
CPC ......... *H01H 9/54* (2013.01); *H01L 31/02021* (2013.01); *H02H 3/08* (2013.01);
(Continued)

(58) Field of Classification Search
CPC ... H01H 9/54; H02H 3/08; H02H 3/20; H01L 31/02021; Y10T 307/865; Y10T 307/826; Y10T 307/858; Y02E 10/50
(Continued)

(56) References Cited

U.S. PATENT DOCUMENTS 7,633,727 B2 * 12/2009 Zhou .................... H02H 1/0015
                                                              361/42
8,213,133 B2    4/2012 Buchhold et al.
(Continued)

FOREIGN PATENT DOCUMENTS

DE    102005018173 A1    10/2006
DE    102006060815 A1    6/2008
(Continued)

OTHER PUBLICATIONS

International Search Report & Written Opinion of the International Searching Authority dated Feb. 24, 2014 for International Application No. PCT/EP2012/067667. 10 Pages.

*Primary Examiner* — Richard Tan
(74) *Attorney, Agent, or Firm* — Eschweiler & Potashnik, LLC

(57) ABSTRACT

The disclosure relates to a safety device for a photovoltaic system for feeding into a power supply system, that includes at least one input for connection to a PV generator, at least one output for connection to an inverter, and a switching element for de-energizing the at least one output. The safety device includes an evaluating unit configured to switch the switching element based on a low-frequency signal at the at least one output. The disclosure also relates to a method for operating such a safety device.

18 Claims, 7 Drawing Sheets

(51) Int. Cl.
  *H01L 31/02* (2006.01)
  *H02H 3/08* (2006.01)
  *H02H 3/20* (2006.01)

(52) U.S. Cl.
  CPC ............... *H02H 3/20* (2013.01); *Y02E 10/50* (2013.01); *Y10T 307/826* (2015.04); *Y10T 307/858* (2015.04); *Y10T 307/865* (2015.04)

(58) Field of Classification Search
  USPC ........................................ 307/125, 130, 131
  See application file for complete search history.

(56) References Cited

U.S. PATENT DOCUMENTS

| | | | |
|---|---|---|---|
| 2009/0140715 A1* | 6/2009 | Adest | H02J 3/385 323/318 |
| 2009/0141522 A1 | 6/2009 | Adest et al. | |
| 2010/0326809 A1 | 12/2010 | Lang et al. | |
| 2011/0127839 A1 | 6/2011 | Takano et al. | |

FOREIGN PATENT DOCUMENTS

| | | |
|---|---|---|
| DE | 102010037760 A1 | 3/2011 |
| DE | 102010054354 A1 | 6/2012 |
| EP | 1326286 A1 | 7/2003 |
| EP | 2048679 A1 | 4/2009 |
| EP | 2299497 A1 | 3/2011 |
| WO | 2010078303 A2 | 7/2010 |
| WO | WO 2010078303 * | 7/2010 |

* cited by examiner

(12)  US 9,865,411 B2

SAFETY DEVICE FOR A PHOTOVOLTAIC SYSTEM

REFERENCE TO RELATED APPLICATIONS

This application is a continuation of International application number PCT/EP2012/067667, filed on Sep. 10, 2012, which claims priority to German application number 10 2011 053 524.1 filed on Sep. 12, 2011.

FIELD

The disclosure relates to a safety device for a photovoltaic system and an operating method for a safety device of a photovoltaic system.

BACKGROUND

Photovoltaic systems, called PV systems abbreviated in the text which follows, are used for converting sunlight into electrical energy. For this purpose, a multiplicity of photovoltaic modules, called PV modules abbreviated in the text which follows, each of which represents an interconnection of a number of photovoltaic cells, is usually interconnected electrically as a photovoltaic generator. The photovoltaic generator (PV generator) is connected to an inverter, frequently mounted remotely, which is used for converting the direct current delivered by the PV generator into alternating current which is suitable for being fed into a public or private (isolated operation) power supply system.

In this context, the PV modules are mostly series-connected in such a manner that the direct-current lines running between the PV generator and the inverter are loaded with voltages of substantially more than 100 V. For reasons of efficiency, a voltage of this order of magnitude is suitable, among other things, in order to keep ohmic losses in the lines tolerably small without having to select a line cross section which is too large. With a light incidence on the PV modules, however, the risk of a lethal electric shock exists due to the high voltage in the case of damages, e.g., in the case of fire, or during installation and maintenance work. Without further protective measures, the danger to life in the case of a direct contact or an indirect contact, e.g., via quenching water, can only be banned if the power generation by the PV modules is stopped, for example, by darkening the PV modules. This is difficult to implement in the case of large PV systems or in the case of fire, however.

In order to avoid the occurrence of hazardous voltages especially at accessible or exposed components of a PV-system during certain situations, e.g., in the case of fire or during maintenance work at a PV system, it is known to arrange switching elements, e.g., electromechanical switches, contactors or semiconductor switches in spatial vicinity of the PV modules, for example, in a connecting socket of the PV module. The switching elements are controlled by the inverter or any other control center via control lines and de-energize the power transmitting connecting lines between the PV modules and the inverter. This can be done either by interrupting the connecting lines by means of the switching elements or by short-circuiting the PV modules as disclosed, for example, in the journal Photon, May 2005 edition, pp. 75-77.

The connecting lines between the PV generator and the inverter can also be de-energized by a single switching element arranged at the PV generator as disclosed in the printed document DE 10 2005 018 173 A1. Printed document DE 10 2009 022 508 A1 discloses a similar setup, where a switching element for de-energizing the power transmitting connection lines between a PV generator and an inverter is arranged in close proximity of the PV generator. The switching element is mains-operated for de-energizing the connection lines depending on the status of the buildings power-supply system. In this case, "mains-operated" means that the switching element is directly coupled to the buildings power-supply. Accordingly, a power-supply line has to be provided at the PV-generator.

In all these cases, additional lines have to be provided for transmitting the control signals to the switching elements located at the PV-generator.

As an alternative, it is known from the printed document DE 10 2006 060 815 A1 to send the control signals as radio-frequency signals via the direct-current lines which are used for the transmission of electric power from the PV-generator to the inverter. For this purpose, the switching elements are provided with a control unit which decodes the control signals transmitted at radio frequency and controls the switching process. To generate the radio-frequency control signals, separate and generally elaborate and costly signal generators are provided. The use of radio-frequency control signals also necessitates a relatively high expenditure in the electromagnetic shielding of the signal generators in order to meet the EMC (electromagnetic compatibility) guidelines.

SUMMARY

The present disclosure is directed to a safety device for a PV system which, with a simple structure, reliably and safely prevents at least a significant length of the direct-current (DC) lines connecting a PV generator to an inverter from being loaded with high voltages in certain situations, e.g., in the case of danger. The present disclosure is also directed to an operating method for such a safety device.

A safety device according to the disclosure for a photovoltaic system for feeding into a power supply system comprises an input for connection to a PV generator and at least one output for connection to an inverter, and comprises a switching element for de-energizing the at least one output. The safety device also has an evaluating unit configured to switch the switching element based on a low-frequency signal which is present at the at least one output.

In the case of commercial inverters, a low-frequency signal of low amplitude relative to the earth potential is applied to at least one of the direct-current inputs of the inverter, as soon as the inverter is connected to a functional power supply system. The disclosure makes use of this fact to remotely de-energize the direct-current lines.

The low low-frequency signal is also observed when an internal switching element of the inverter is switched off, for example, at night, when no power sufficient for feeding-in is supplied by the PV generator. It is only when an isolating element preceding the inverter (seen in direction to the power supply system), for example, a main switch of the PV system or a main fuse switch of the complete building, is opened or when the power supply system does not provide any voltage that no low-frequency signal is observed at one of the direct-current inputs of the inverter and therefore also not at the direct-current lines which are connected to the input of the inverter. In consequence, the switching element is switched when the isolating element preceding the inverter is operated due to the detection of the low-frequency signal which is applied or not applied to the direct-current lines. Therefore, the switching element de-energizes the power transmitting connection lines (i.e., the direct-current lines) between the PV-generator and the inverter without needing any dedicated additional signal transmission line. Furthermore, no dedicated signal generator is needed for this purpose, which otherwise would, for example, be the case when a radio-frequency control signal is used. Instead, the low-frequency (interference) signal provided inherently by the inverter is utilized to control the switching element. In the case of danger, e.g., in case of a fire, a normal procedure includes de-energizing the PV system from the alternating-current side by means of the isolating element. The safety device according to the application then automatically also de-energizes the direct-voltage side and thus provides, for example, for safe extinguishing work.

Within the context of the application, a de-energized state of the at least one output is here understood to be a safe state in which a contact of conductors or elements connected to the output is not associated with a danger to life or health, even if the conductors or elements do not have an electrical insulation or have a damaged insulation.

In an advantageous embodiment of the safety device, the low-frequency signal is a voltage signal. In one embodiment the safety device then has a terminal for connection to an earth potential, and the evaluating unit is configured to determine the voltage signal between the at least one output and the earth potential. In an advantageous embodiment of the safety device, the low-frequency signal is a current signal. In one embodiment the safety device has a current measuring device connected to the evaluating unit, and the evaluating unit is configured to determine a current flowing via the at least one output as a current signal. Both, the measuring of a voltage or a current signal represent suitable possibilities for detecting the low-frequency signal. A combination in which both a voltage and a current signal are measured is also possible. Depending on the characteristics of the PV generator and depending on the operating and environmental conditions, e.g., humidity, a voltage or a current measurement is more suitable for reliably detecting the low-frequency signal. The combination of both measurements can thus be advantageous for a reliable detection of the low-frequency signal.

In a further advantageous embodiment of the safety device, the low-frequency signal has a frequency which corresponds to an integral multiple of the system frequency in the power supply system. In one embodiment the frequency corresponds at least to one and at most to 10-times the system frequency in the power supply system. The low-frequency signal is especially distinct at the system frequency itself or at a small integral multiple of the system frequency, which is why a measurement at such a frequency is especially suitable.

In further advantageous embodiments of the safety device, de-energization of the at least one output occurs via a short circuit at the inputs of the safety device or by separating the connection of the at least one input and the at least one output. Both are suitable possibilities for switching the output free of hazardous voltages.

A method according to the disclosure for operating a safety device for a photovoltaic system for feeding into a power supply system is provided. The method comprises determining a level of a low-frequency signal at at least one output of the safety device, connected to an inverter. The method comprises connecting the output to an input which is coupled to a PV generator if the level of the low-frequency signal is above a first threshold value. If the level of the low-frequency signal is below a second threshold value, the method comprises de-energizing the output. This results in the same advantages as described in conjunction with the safety device according to the disclosure.

BRIEF DESCRIPTION OF THE DRAWINGS

In the text which follows, the disclosure will be explained in greater detail by means of example embodiments with the aid of eight figures, in which.

DETAILED DESCRIPTION

Figure 1:
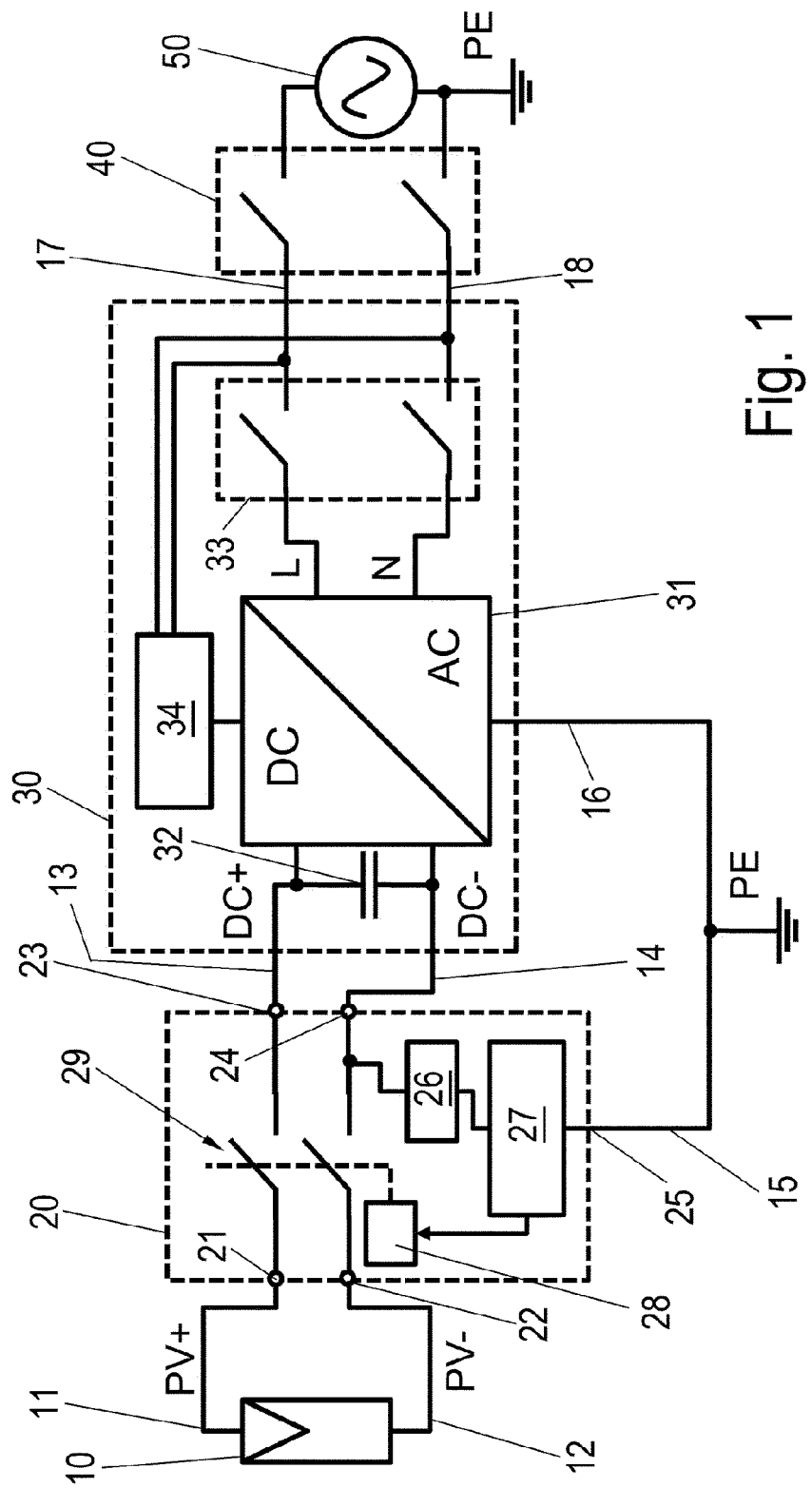
FIG. 1 shows a diagrammatic representation of a PV system with a safety device in a first example embodiment.

FIG. 1 shows diagrammatically the basic configuration of a PV system with a safety device in a first example embodiment.

The PV system has a PV generator 10 which is connected via connecting lines 11, 12 to inputs 21 and 22 of a safety device 20. The safety device 20 also has outputs 23 and 24 from which direct-current lines 13 and 14 lead to an inverter 30 which is connected to a power supply system 50 via alternating-current lines 17, 18 via an isolating element 40. The direct-current lines 13 and 14 are used for transmitting the photovoltaic power generated by the PV generator 10 to the inverter 30.

As an example, the PV generator 10 in FIG. 1 is symbolized by the circuit symbol of an individual photovoltaic cell. In an implementation of the PV system shown, the PV generator 10 can be an individual PV module which, in turn, contains a multiplicity of photovoltaic cells. Similarly, the PV generator 10 can also be a series connection of a number of PV modules, a so-called string, in which the voltages of the individual PV modules add up. A parallel connection or a mixed series and parallel connection of PV modules is also possible.

The inverter 30 has as a central component a DC/AC converter 31. The inverter 30 has at its DC-side input an input capacitance which is symbolized in the figure by an input capacitor 32 connected in parallel with the input. For example, the DC/AC converter 31—and thus the inverter 30—are designed for a single-phase feed into the power supply system 50. Naturally, however, the inverter 30 can also be designed to be multi-phased, especially three-phased. By way of example, the power supply system 50 is represented as a single-phase system with one phase L and a neutral conductor N, in which context, naturally, it can have other phases which are only not contacted in the case of the PV system shown. Additionally, there is in the power supply system 50 a connection between the neutral conductor N and earth potential PE. The earth potential PE is also available at the safety device 20 via a connecting line 15 between a further earth potential terminal and the terminal 25 of the safety device 20 and also at the inverter 30 via a connecting line 16 between the further earth potential terminal and the inverter 30.

If necessary, the inverter additionally contains between the input capacitance 32 and the DC/AC converter 31 a DC/DC converter and downstream a DC-link capacitance (not shown in FIG. 1). The DC/DC converter converts the DC voltage of the PV generator into a DC voltage which is within the working range of the DC/AC converter and provides the converted DC voltage across the DC-link capacitance.

At the alternating-current end, the DC/AC converter 31 can be connected via a two-pole internal switching element 33 to the output of the inverter 30 and thus lastly to the power supply system 50. The internal switching element 33 then separates both phase L and the neutral conductor N of the connection to the power supply system 50. In case of a multi-phase inverter 30, the internal switching element 33 is correspondingly designed to be multi-pole so that the separation from the power supply system 50 extends to all phases.

Furthermore, the inverter 30 comprises a measuring arrangement 34 which is connected, on the one hand, to the alternating-current output of the inverter 30 and, on the other hand, has a connection to the direct-current side of the DC/AC converter 31. The measuring device 34 is used for determining parameters of the system voltage which are of relevance for the operation of the inverter 30. Information about these parameters of the system voltage are needed especially also when the internal switching element 33 on the output side is opened.

Thus, the output voltage of the DC/AC converter is synchronized with an amplitude and phase with the system voltage e.g. during the start-up phase of the inverter. This synchronization takes place with the opened internal switching element 33. It is only after completed synchronization that the inverter is linked to the system by closing the internal switching element 33. This is why the measuring device 34 is contacted directly at the output of the inverter 30 and not at the alternating-current output of the DC/AC converter 31.

The safety device 20 is used for preventing the occurrence of dangerously high voltages at the outputs 23, 24 and thus at the direct-current lines 13, 14 which lead to the inverter 30, in the case of danger, independently of the voltage provided by the PV generator 10. Since the PV generator 10 applies a voltage of possibly lethal amplitude to the connecting lines 11, 12 in the case of irradiation of light, the safety device 20 is, in one embodiment, positioned as closely as possible to the PV generator 10 in order to keep the length of the connecting lines 11, 12 correspondingly short.

To be able to de-energize the outputs 23, 24 and thus the direct-current lines 13, 14, the safety device 20 has a switching element 29 between inputs 21, 22 and outputs 23, 24 which is driven by a driver circuit 28. The switching element 29 can be, for example, a contactor, but the use of semiconductor switches is also conceivable. Suitable semiconductor switches are here, e.g., IGBTs (Insulated Gate Bipolar Transistors) or MOSFETs (Metal Oxide Semiconductor Field Effect Transistors). The switching element 29 can switch both outputs 23 and 24, as shown. However, it is also possible to switch only one of the outputs 23 or 24 by means of the switching element 29. It can also be provided, for example for increasing the switching reliability, to use a number of switches, for example a number of semiconductor switches in a series interconnection as the switching element 29. In one embodiment, the switching element has means for extinguishing and/or avoiding a switching arc. A switching arc can be extinguished or avoided, respectively, e.g., by using a vacuum switching contactor or by a combination of semiconductor switches and electromechanical switches.

Instead of separating the connections between the inputs 21, 22 and outputs 23, 24, it is also possible to arrange the switching element in such a manner that inputs 21, 22 are short-circuited for the de-energizing.

The driver circuit 28 and via this the switching element 29 are driven by an evaluating unit 27 which is connected to the output 24 and thus to the negative direct-voltage potential DC- of the inverter 30 via a filter 26 and which is connected to the earth potential PE via the input 25. The components of the safety device 20 are energized via the PV voltage present at inputs 21, 22. Corresponding devices for supplying the components with power (buck converter, voltage regulator etc.) are not shown for reasons of clarity.

The filter 26 in one embodiment allows a low-frequency alternating voltage to pass, especially an alternating voltage the frequency of which is a small integral multiple of the system frequency. The filter 26 can thus be designed to pass, e.g., the system frequency (fundamental frequency), twice or several times the system frequency. However, the frequency to which the filter 26 is designed to pass typically does not exceed 10-times the system frequency. It can be constructed, for example, as an analog band-pass filter or high-pass filter. A digital signal processing with a corresponding filter characteristic of a band-pass or high-pass filter is also conceivable for implementing the filter 26.

The evaluating unit 27 is configured to determine the level of the signal at the output of the filter 26 with respect to the earth potential PE, and switch the switching element 29 based on the magnitude of the level. It is only when a predetermined magnitude of the level is exceeded that the switching element 29 switches on and connects the outputs 23, 24 to the inputs 21, 22 and thus applies the PV voltage to the direct-current lines 13, 14.

Figure 2:
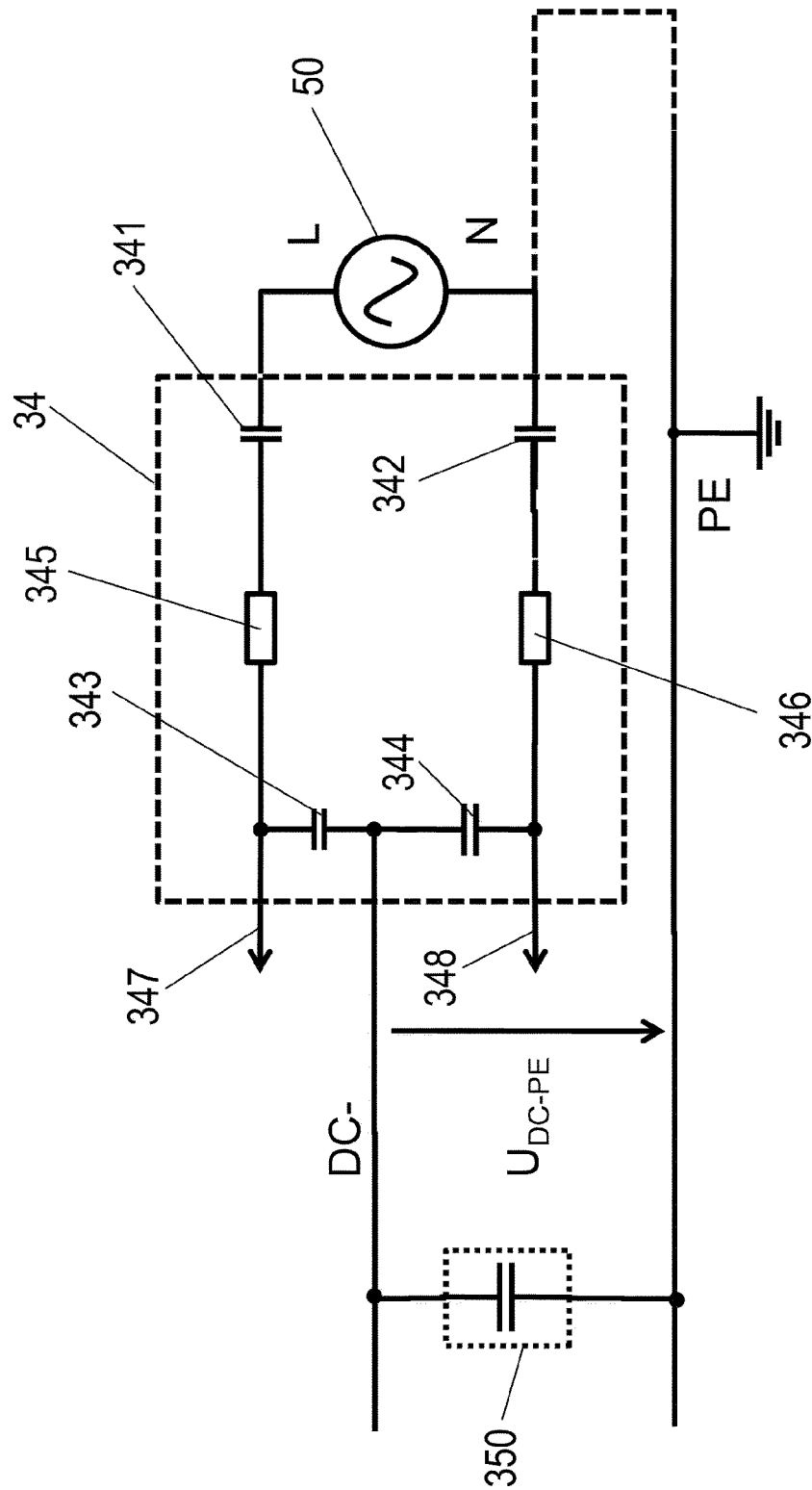
FIG. 2 shows an equivalent circuit of a measuring device contained in an inverter.

As will still be explained in greater detail in conjunction with FIG. 2, a low-frequency, usually system-frequency signal of low amplitude compared with the earth potential is applied to the negative direct-current input (DC−) in commercial inverters 30 as soon as the inverter 30 is connected to an operating power supply system 50. This also applies when the internal switching element 33 of the inverter 30 is switched off, for example, at night when no power sufficient for feeding-in is provided by the PV generator 10. It is only when the isolating element 40 preceding the inverter 30, e.g., a main switch of the PV system or a main fuse switch of the complete building, is opened or when the power supply system 50 does not provide any voltage that no low-frequency signal is observed at the negative direct-current input (DC−) of the inverter 30. In consequence, the switching element 29 switches simultaneously with or with a short delay time only compared to the isolating element 40 preceding the inverter 30 due to the detection of the system-frequency signal. For this purpose the control mechanism of the switching element 29 of the safety device 20 is provided without the necessity of a dedicated signal line for signal transmission. Also, no dedicated signal generator is needed for generating a radio-frequency control signal. Instead, the system-frequency (interference) signal produced inherently by the inverter 30 is utilized for controlling the switching element 29. In the case of danger, e.g., in the case of fire, a normal procedure consists in de-energizing the PV system from the alternating-current side by means of the isolating element 40. The safety device 20 according to the application then automatically also de-energizes the direct-voltage side due to the fact, that no low-frequency signal is detected by the evaluating unit 27 at the output 24 connected to the direct-current line 14. Therefore a safe extinguishing work is guaranteed.

In the text which follows, the origin of the low-frequency signal used for controlling the switching element 29 is explained by means of FIG. 2.

FIG. 2 shows an equivalent circuit of the measuring device 34 of the inverter 30. The purpose of the measuring device 34 is to provide parameters of the power supply system, for example the magnitude and the variation with time of the system voltage for controlling the inverter 30 and especially for controlling the DC/AC converter 31 in the form of a harmless low voltage. In the case shown, the DC-potential at the negative direct-current input, that is to say at the input of the inverter 30 connected to the direct-current line 14 in FIG. 1 represents the reference potential within the DC/AC converter 31. Within the measuring device 34, phase L and the neutral conductor N of the power supply system 50 are brought to a more easily managed low-signal level with this DC- potential as reference potential via a network of capacitors 341 to 344 and resistors 345 and 346. The actual measurement of the system voltage parameters is not shown in the equivalent circuit of FIG. 2. It takes place at the test points 347 and 348 symbolized by arrow points.

In this context, it is of relevance to the subject matter of the application that due to the coupling between the AC side and the DC side, a system-frequency alternating voltage with respect to earth potential PE is applied to the negative and/or positive direct-current input of the inverter 30. The amplitude of this alternating-voltage signal depends on the magnitude of the system voltage, the sizes of the coupling elements, that is to say of the coupling capacitors 341 to 344 and of the coupling resistors 345, 346, and on a leakage capacitance 350, which represents the capacitance of the direct-voltage side of the PV system, especially of the PV generator 10 and of the direct-current lines 11, 12 and 13, 14 with respect to the earth potential PE. In FIG. 2, this leakage capacitance is symbolized by an equivalent capacitor 350.

In many cases, the system-frequency signal is coupled also from the DC− direct-current line 14 via the input capacitor 32 and/or a DC-link capacitor (not shown) to the DC+ direct-current line 13 so that lastly the system-frequency signal is present on both direct-current lines 13, 14. As an alternative option to the case shown, it is also conceivable that, instead of the DC- potential, the DC+potential is selected as the reference potential for the voltage measurement. In this case, the system-frequency signal is first coupled into the DC+direct-current line 13 from where it is then transmitted via the input capacitor 32 and/or possibly the DC-link capacitor to the DC− direct-current line 14. Here, too, the signal is then lastly present on both direct-current lines 13, 14. As an alternative to the exemplary embodiments shown in FIGS. 1 and 2, in which the filter 26 taps off a signal present on the DC− direct-current line 14 at the output 24 of the safety device 20, the filter 26 can also be connected to the output 23 in order to tap off a signal present on the DC+ direct-current line 13.

Figure 3:
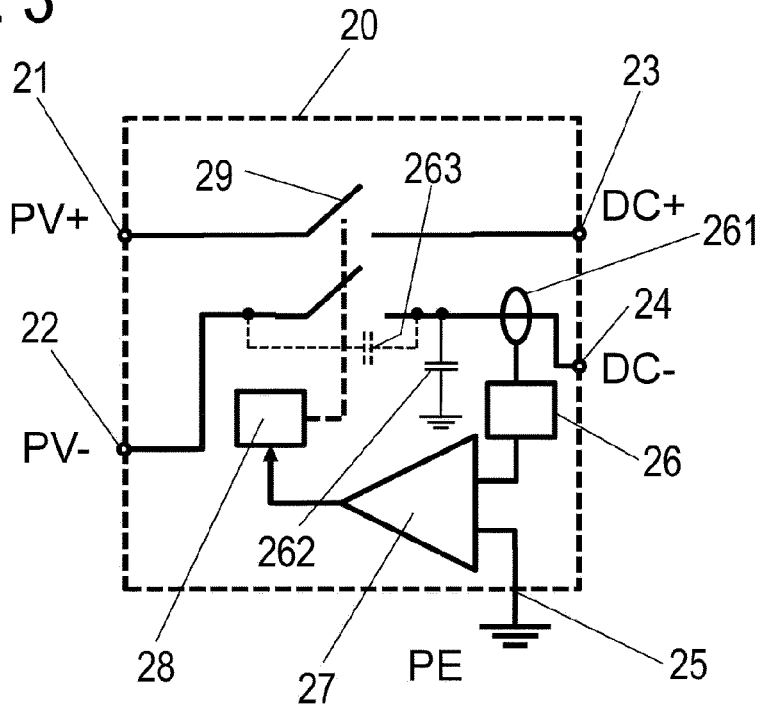
FIGS. 3 to 6 show in each case a circuit diagram of a further example embodiment of a safety device.

FIG. 3 shows a second example embodiment of a safety device 20 which could be used in a PV system shown in FIG. 1. Identical reference symbols identify identical or equivalent elements as in FIG. 1 in this and also in the following figures. Devices for supplying power to the components of the safety device 20 are again not shown.

The basic structure of the safety device 20 of FIG. 3 corresponds to that of FIG. 1. With regard to the inputs and outputs 21-24, the switching element 29 and the driver circuit 28, reference is made to the description in conjunction with FIG. 1. For coupling the system-frequency signal out at the output 24, an inductive coupling 261 is used here, for example implemented by a Rogowski coil. The Rogowski coil thus forms a current measuring device for low-frequency current which flows via the output 24. After filtering by the filter 26, the current signal coupled out is supplied, together with the earth potential PE, to the evaluating unit 27. The evaluating unit 27 is constructed, for example, as a comparator which is preceded by a rectifying amplifier. When the level of the signal at the output of the filter 26 exceeds a first predetermined value, the driver circuit 28 turns on the switching element 29. If the level drops below a second predetermined value, the driver circuit 28 turns the switching element 29 off again. The first predetermined value corresponds to a first turn-on threshold value for the signal and the second predetermined value corresponds to a turn-off threshold value. Preferredly, a switching hysteresis is provided in that the turn-off threshold value is below the turn-on threshold value in order to achieve a secure switching behavior. Furthermore, the gain of the amplifier in the evaluating unit 27 is, in one embodiment adjustable in order to adapt the safety device 20 to the signal level of the system-frequency signal since the latter, as is stated in conjunction with FIG. 2, can be different individually for different PV systems. It also can differ within a certain tolerance band for an individual but fixed PV system with respect to time. This is due to the fact that the leakage capacitance between the PV-generator and earth potential PE depends among other parameters on environmental conditions—e.g., weather—which conditions may change during time.

In the example embodiment of FIG. 3, the system-frequency signal is detected as a current signal. In order to ensure that a low-frequency current signal can flow on at least DC− direct-current lines 14 and can be observed at the output 24 even with the switching element 29 opened, a capacitor 262 is provided which provides a path for a low-frequency current toward the earth potential PE. As an alternative, a capacitor 263 (shown dashed in FIG. 3) can also be provided which bridges the switching contact, connected to the output 24, of the switching element 29. Such a capacitor 263 provides for a low-frequency current flow toward the earth potential via the PV generator 10, e.g., when the PV generator 10 is earthed with one of its terminals (single-pole earthing).

Figure 4:
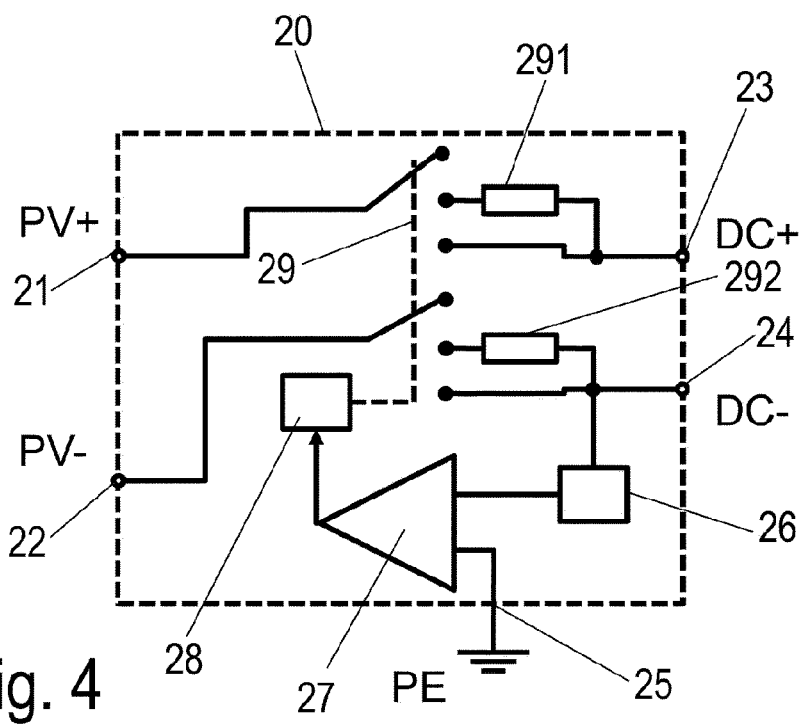

FIG. 4 shows a further example embodiment of a safety device 20. In distinction from the example embodiment of FIG. 3, the filter 26 is here coupled directly to the output 24. Thus, it is not a current signal but a voltage signal which is detected. As an alternative, it is also possible to detect both a current and a voltage signal. The operating states and the environmental conditions, e.g., humidity, influence the leakage capacitance (compare equivalent capacitor 350 in FIG. 2) of the PV generator 10 and thus its impedance with respect to the earth potential PE. Depending on the impedance with respect to earth potential PE, the voltage or the current signal is more distinct at the output 24. Detecting both current and voltage signal offers the advantage that an informative signal is available independently of the operating states and environmental conditions of the inverter 30 and of the PV generator 10.

In addition, the switching element 29 is constructed in three stages in this example embodiment. Apart from the turn-on and turn-off stages, an intermediate switching stage is provided in which the inputs and outputs 21, 22 and 23, 24, respectively, are connected via in each case one high-resistance resistor 291, 292.

With the isolating element 40 initially turned on, but the internal switching element 33 of the inverter 30 being turned off (e.g., at night), the system-frequency signal only shows a low level at the output 24. When the PV voltage then rises and the safety device 20 starts to operate, it detects the presence of the system-frequency signal and, as in the example embodiment of FIG. 3, immediately turns on the switching element 29. After turning on the switching element 29 the level of the signal is reduced due to the added leakage capacitance of the PV generator 10 with respect to the earth potential PE. This could lead to the level of the system-frequency signal dropping below the threshold value at which the switching element 29 turns off again. In order to prevent this, the intermediate switching stage of the switching element 29 is first activated when the turn-on threshold is exceeded in the example embodiment of FIG. 4 and, if the turn-on threshold is also exceeded after a predetermined time has elapsed which, for example, lies within a range of a few 10 seconds, the switching element 29 is first turned on completely. By means of the intermediate switching stage, direct voltage is applied to the input of the inverter 30 whereupon this starts to operate and turns on the internal switching element 33. The influence of the capacitance of the PV generator is reduced by the resistors 291, 292 which is why the turn-on level is initially exceeded further. As a rule, the level of the system-frequency signal also rises due to the internal switching element 33 being turned on. After a predetermined time has elapsed, the switching element 29 is turned on completely in one embodiment. In this situation as a result the level of the system-frequency signal is sufficiently high so that it no longer drops below the turn-off threshold even due to the completely effective leakage capacitance of the PV generator 10.

It is also conceivable to use the intermediate switching stage of the switching element 29 as additional control for the existence of the release signal during a turn-off procedure of the switching element 29. If the level of the signal at the output 24 drops below the second predetermined value, the intermediate switching stage is first activated. In this switching stage, a check is made whether the level still drops below the second predetermined value for complete turn-off. If this is so, the complete turn-off is effected, otherwise, the switching element is turned on again completely after a predetermined time has elapsed.

In an alternative embodiment of the safety device 20, it is also conceivable that both a low-frequency voltage and a low-frequency current signal is detected. The switching element 29 then turns on if either current or voltage signal are above a predetermined level. In such a case, it is possible to achieve that the system-frequency signal is reliably detected independently of environmental conditions, e.g., humidity, which influence the impedance of the PV generator 10 with respect to the earth potential PE.

Figure 5:
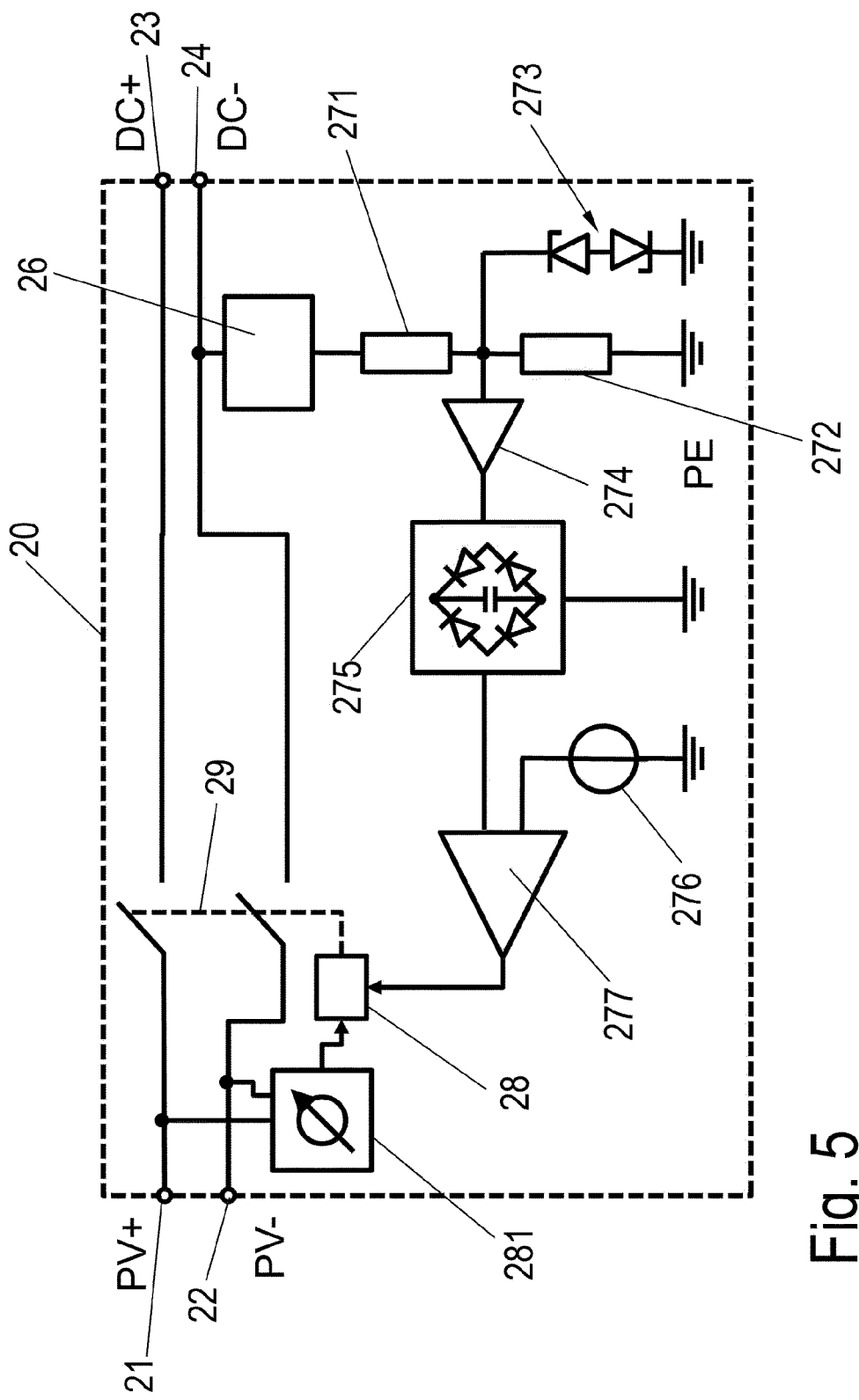

FIG. 5 shows a further example embodiment of a safety device 20. In distinction from the example embodiments previously shown, the amplitude of the PV voltage at inputs 21 and 22 is also evaluated here, apart from the low-frequency signal at output 24, and taken into consideration in controlling the switching element 29. For this purpose, a voltage threshold switch 281 is provided, the output of which is connected to the driver circuit 28. It is only when the PV voltage exceeds a predetermined value and the system-frequency signal meets the predetermined criteria already described before that the switching element 29 turns on. Taking into consideration the amplitude of the PV voltage it can be prevented that the inverter undertakes a turn-on attempt when the PV voltage, and thus the power maximally provided by the PV generator, is not yet sufficient for operating the inverter, e.g. at the break of dawn. Such turn-on attempts lead to unnecessary switching processes of the switching element 29 and possibly also of the internal switching element 33 which reduces their service life.

As in the example embodiment of FIG. 4, the system-frequency signal at the output 24 is detected voltage-coupled. It is shown somewhat more detailed in the present case. The signal present at the output of filter 26 is limited in amplitude via a voltage divider of the resistor 271 and a further resistor 272 connected in parallel with a Zener diode arrangement 273 in order to prevent a destruction or overdriving of the subsequent components. The voltage-limited signal is firstly amplified by an amplifier 274. The amplifier 274, in one embodiment, has an adjustable gain factor which provides for optimum adaptation to the magnitude of the system-frequency signal and thus to the individual PV system. The amplified signal is rectified in a downstream rectifier 275, smoothed and supplied to a comparator 277 where it is compared with a reference voltage which is provided by a reference voltage source 276 connected to earth potential.

Figure 6:
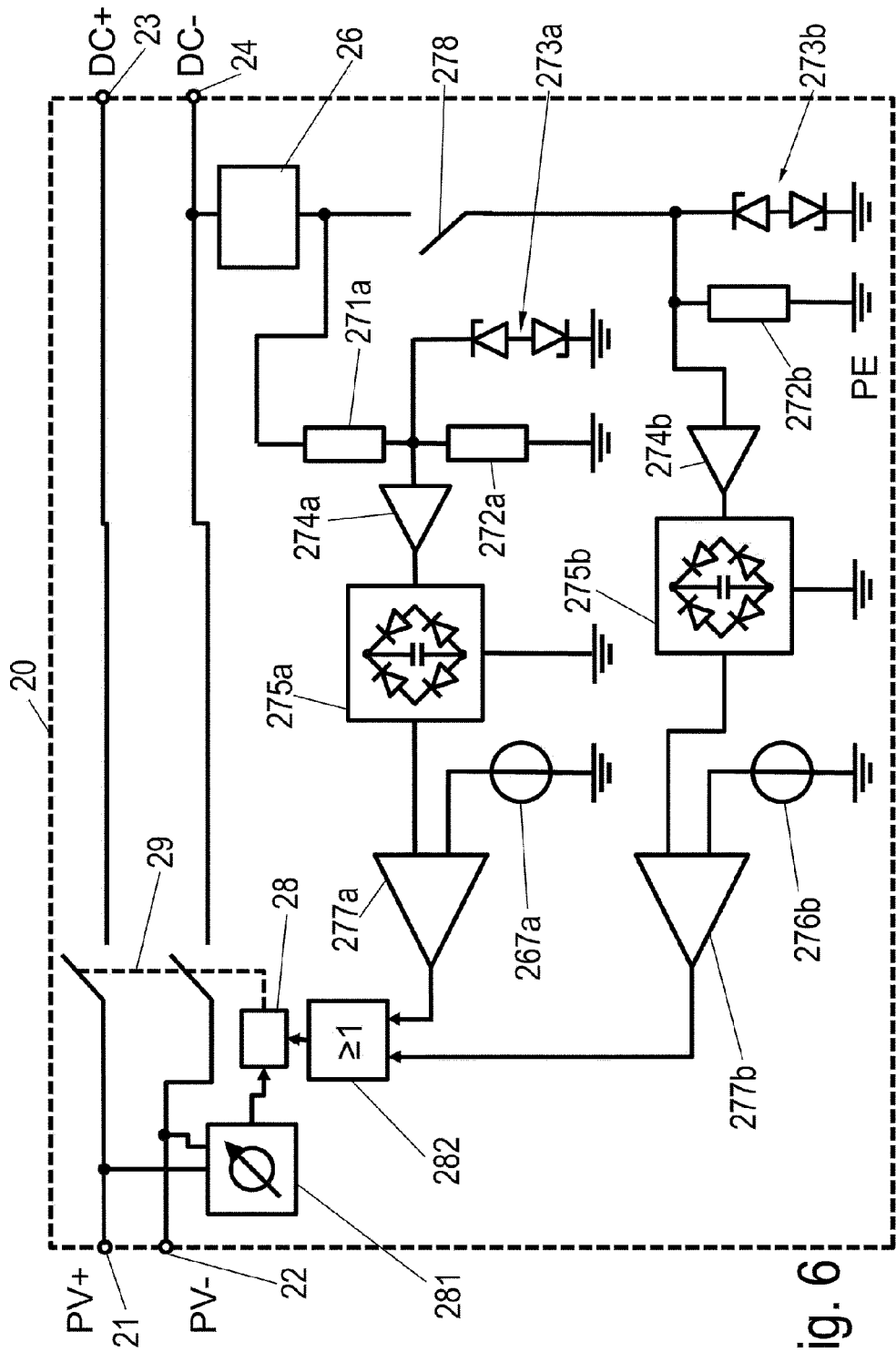

FIG. 6 shows an extension of the circuit from FIG. 5. Two detection circuits are provided here starting from the output of filter 26. A first one corresponds to that shown in FIG. 5 and is presently formed by two resistors 271a, 272a, a zener diode arrangement 273a, an amplifier 274a, a rectifier 275a, a reference voltage source 276a and a comparator 277a. A second detection circuit has a second rectifier 275b, a second reference voltage source 276b and a second comparator 277b. The second rectifier 275b is connected to the output of the filter 26 via a switch 278, a resistor 272b and a zener diode arrangement 273b being provided again for voltage limiting. The outputs of the two comparators 277a, 277b are linked to one another via an Or element 282 and then supplied to the driver circuit 28. In this arrangement, the second detection circuit has a distinctly higher sensitivity than the first one. The switch 278 is closed at first. The second detection circuit is suitable for reliably turning on the switching element 29 even at the lowest signal levels to be expected of the system-frequency signal at output 24. If distinctly higher signal levels occur in the operation of the inverter 30, the first detection circuit also responds and also drives the switching element 29 via the OR element 282 and the driver circuit 28. In the case of the existence of relatively high signal levels, the switch 278 is opened and as a result the second detection circuit is protected against overdriving.

Figure 7:
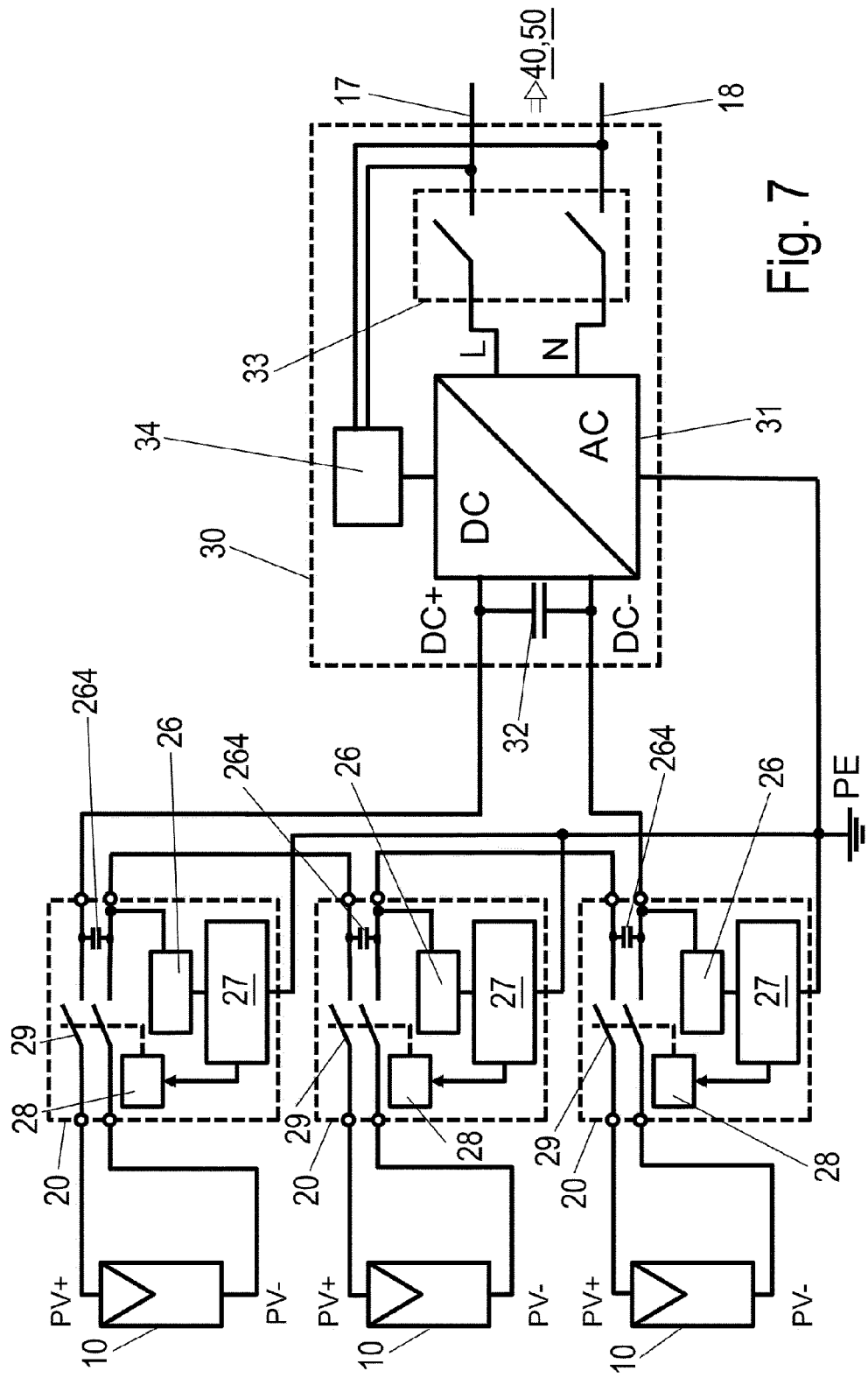
FIG. 7 shows a diagrammatic representation of a PV system having a number of safety devices in another example embodiment.

FIG. 7 shows in a representation similar to FIG. 1 diagrammatically the basic structure of a PV system with safety devices in a further example embodiment.

In the PV system of FIG. 7, a number of PV generators 10, for example, three in this case, are provided which are also called PV part-generators 10 in the text which follows. Each of the PV part-generators 10 is connected to a separate safety device 20. The outputs of the safety devices 20, which, for reasons of clarity, are not provided with reference symbols in the figure, are connected in series with one another. The series circuit of the safety devices 20 corresponds in the case that the switching elements 29 are closed in each case, also to a series circuit of the PV part-generators 10. The series circuit of the PV part-generators is connected to the input of the inverter 30. The latter, in turn, is linked to a power supply system 50 via an isolating element 40 (e.g., a system mains switch). The isolating element 40 and the power supply system 50 are not shown in FIG. 5 for reasons of space.

With respect to the safety devices 20 and the inverter 30, reference is made to the description in conjunction with the preceding figures. In the distinction from the exemplary embodiments shown before, however, capacitors 264 are additionally provided between the outputs of the safety devices 20 in the example of FIG. 7. Similar to the capacitors 262 and 263 in FIG. 3, the capacitors 264 ensure that even with switching elements 29 opened, a low-frequency signal is present at the outputs of all the safety devices 20. Such a low-frequency, especially system-frequency signal can thus be detected separately by each of the safety devices 20 whereupon the corresponding safety devices 20 switch on their switching elements 29. When this has occurred at each of the safety devices 20, the PV voltage of the PV part-generators summed together by the series circuit is applied to the direct-current lines 13, 14 and therefore to the input of the inverter 30.

Such a safety device 20 with capacitor 264 at the outputs is especially suitable for integration with a single PV module as PV part-generator 10. In one embodiment, the safety device 20 can then be integrated into a connecting socket of the PV module. This avoids exposing lines to which a potentially hazardous voltage is applied.

Figure 8:
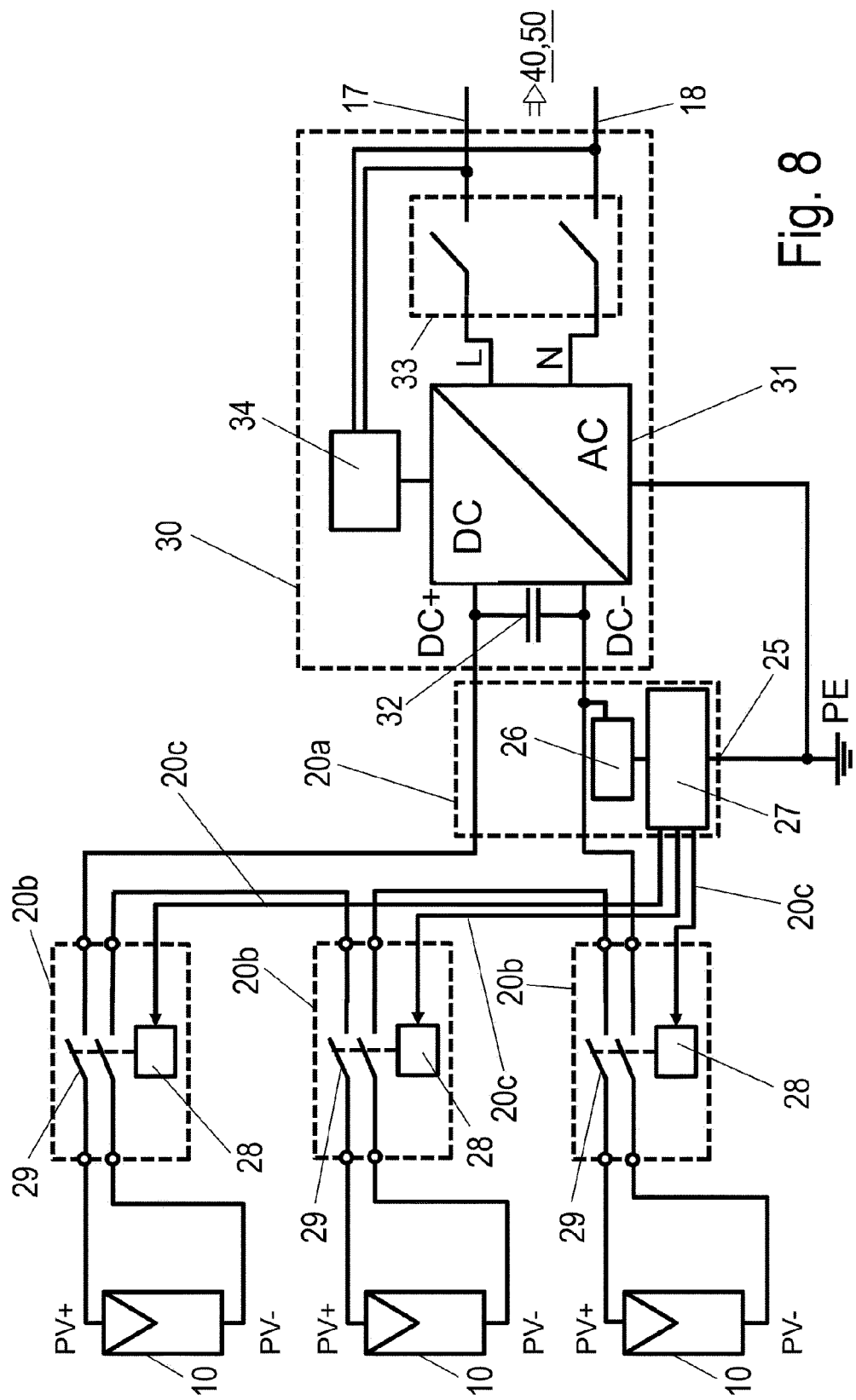
FIG. 8 shows a diagrammatic representation of a PV system comprising a safety device in another example embodiment.

FIG. 8 diagrammatically shows the basic structure of a PV system comprising a safety device in a further example embodiment. In the basic structure, this PV system corresponds to that shown in FIG. 7. A number of PV part-generators 10 are again arranged to be serially interconnectable and coupled to an inverter 30. In distinction from the example embodiment shown in FIG. 7, one switching unit 20b is presently provided for each of the PV part-generators 10. Each of the switching units 20b is connected to a central detection device 20a via a control line 20c. The switching units 20b, together with the control lines 20c and the central detection device 20a are forming the safety device 20. The central detection device 20a is arranged, in one embodiment close to the generator in order to keep the wiring expenditure in the control lines 20c as low as possible. The central detection device 20a has such components of the safety device 20 which can be used jointly in conjunction with all the PV part-generators 10, for example the filter 26 and the evaluating unit 27. The switching units 20b in each case comprise at least the switching element 29 and possibly, as in the present example, a driver circuit 28 for the switching element 29. However, the driver circuit 28 could possibly also be arranged centrally in the detection device 20a.

The invention claimed is:

1. A safety device for a photovoltaic system for feeding into a power supply system, the safety device comprising:
at least one input for connection to a PV generator;
at least one output for connection to an inverter;
a switching element for de-energizing the at least one output; and
an evaluating unit configured to switch the switching element based on a low-frequency signal present at the at least one output, wherein the low-frequency signal comprises a frequency which corresponds at least to one and at most to 10-times a system frequency in the power supply system, and wherein the low frequency signal is provided inherently by a measurement circuit of the inverter when the inverter is connected to the safety device without the low-frequency signal being generated by a dedicated signal generator, wherein the measurement circuit is used to determine parameters of a system voltage that are of relevance to a synchronization of the inverter to a grid.

2. The safety device as claimed in claim 1, wherein the evaluating unit is configured to measure the low-frequency signal as a voltage signal.

3. The safety device as claimed in claim 2, further comprising a terminal for connection to an earth potential, wherein the evaluating unit is configured to determine the voltage signal between the at least one output and the earth potential.

4. The safety device as claimed in claim 1, wherein the evaluating unit is configured to measure the low-frequency signal as a current signal.

5. The safety device as claimed in claim 4, further comprising a current measuring device connected to the evaluating unit, wherein the evaluating is configured to determine a current flowing via the at least one output as current signal.

6. The safety device as claimed in claim 1, wherein the low-frequency signal comprises a frequency which corresponds to an integral multiple of the system frequency in the power supply system.

7. The safety device as claimed in claim 1, comprising a band-pass filter coupled between the evaluating unit and an output of the at least one output.

8. The safety device as claimed in claim 1, further comprising an amplifier configured to amplify the low-frequency signal.

9. The safety device as claimed in claim 1, wherein the safety device is configured to connect the at least one input to the at least one output at a signal level above a first threshold value.

10. The safety device as claimed in claim 9, wherein the safety device is configured to de-energize the at least one output at a signal level below a second threshold value.

11. The safety device as claimed in claim 9, wherein the second threshold value is less than the first threshold value.

12. The safety device as claimed in claim 1, wherein a de-energizing of the at least one output takes place via a short circuit of the inputs of the safety device.

13. The safety device as claimed in claim 1, wherein a de-energizing of the at least one output takes place via a separating of the connection of the at least one input and the at least one output.

14. The safety device as claimed in claim 1, wherein the switching element comprises means for extinguishing an arc.

15. The safety device as claimed in claim 1, further comprising a central detection unit with the evaluating unit and at least one switching unit with the switching element, wherein the central detection unit and the at least one switching unit reside in separate housings.

16. A method for operating a safety device for a photovoltaic system for feeding into a power supply system, the safety device comprising at least one input for connection to a PV generator and at least one output for connection to an inverter, and comprising a switching element for de-energizing the at least one output, comprising:
determining a level of a low-frequency signal at the at least one output, wherein the low-frequency signal comprises a frequency which corresponds at least to one and at most to 10-times a system frequency in the power supply system, and wherein the low frequency signal is provided inherently by a measurement circuit of the inverter when the inverter is connected to the safety device without the low-frequency signal being generated by a dedicated signal generator, and wherein the measurement circuit is used to determine parameters of a system voltage that are of relevance to a synchronization of the inverter to a grid;
connecting the at least one output to the at least one input, if the level of the low-frequency signal is above a first threshold value; and de-energizing the at least one output if the level of the low-frequency signal is below a second threshold value.

17. The method as claimed in claim 16, wherein the level of the low-frequency signal is determined at a frequency which corresponds to an integral multiple of a system frequency in the power supply system.

18. The safety device as claimed in claim 1, wherein the low-frequency signal comprises a frequency which corresponds to either one or 3-times the system frequency in the power supply system.

* * * * *